United States Patent
Olson et al.

(10) Patent No.: US 7,391,038 B2
(45) Date of Patent: Jun. 24, 2008

(54) TECHNIQUE FOR ISOCENTRIC ION BEAM SCANNING

(75) Inventors: Joseph C. Olson, Beverly, MA (US); Anthony Renau, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 221 days.

(21) Appl. No.: 11/385,634

(22) Filed: Mar. 21, 2006

(65) Prior Publication Data

US 2007/0221870 A1   Sep. 27, 2007

(51) Int. Cl.
*H01J 37/317* (2006.01)
*H01J 37/08* (2006.01)
*A61N 5/00* (2006.01)

(52) U.S. Cl. ............... 250/492.21; 250/492.2; 250/492.3; 250/492.1; 250/491.1; 250/440.11; 250/442.11; 250/309; 250/396 R

(58) Field of Classification Search ........... 250/492.21, 250/306, 307, 309, 396 ML, 396 R, 398, 250/400, 440.11, 442.11, 492.1, 492.2, 492.3, 250/491.1
See application file for complete search history.

(56) References Cited

U.S. PATENT DOCUMENTS

| | | | |
|---|---|---|---|
| 3,845,312 A * | 10/1974 | Allison, Jr. .............. 250/398 |
| 5,003,183 A * | 3/1991 | Nogami et al. ........... 250/492.2 |
| 5,046,148 A * | 9/1991 | Nogami et al. ........... 250/492.2 |
| 5,229,615 A * | 7/1993 | Brune et al. ............. 250/492.2 |
| 5,384,465 A * | 1/1995 | Armour et al. ......... 250/492.21 |
| 5,432,352 A * | 7/1995 | van Bavel ............. 250/492.21 |
| 5,594,245 A * | 1/1997 | Todokoro et al. ........... 250/310 |
| 5,898,179 A * | 4/1999 | Smick et al. ........... 250/492.21 |
| 5,918,151 A * | 6/1999 | Tachimori et al. ........... 438/766 |
| 6,163,033 A * | 12/2000 | Smick et al. ........... 250/441.11 |
| 6,207,959 B1 * | 3/2001 | Satoh et al. ............. 250/442.11 |
| 6,331,227 B1 * | 12/2001 | Dykstra et al. ......... 156/345.29 |
| 6,437,350 B1 * | 8/2002 | Olson et al. ........... 250/492.21 |
| 6,437,351 B1 * | 8/2002 | Smick et al. ........... 250/492.21 |
| 6,573,518 B1 * | 6/2003 | Renau et al. ........... 250/492.21 |
| 6,740,894 B1 * | 5/2004 | Mitchell ................. 250/492.21 |
| 6,909,102 B1 * | 6/2005 | Buccos ................. 250/492.21 |
| 7,057,192 B2 * | 6/2006 | Kaim et al. ............. 250/492.21 |
| 7,067,808 B2 * | 6/2006 | Kochi et al. ................. 250/307 |
| 7,105,838 B2 * | 9/2006 | Naylor-Smith et al. . 250/492.21 |
| 7,223,983 B2 * | 5/2007 | Kawasaki et al. ........... 250/398 |
| RE40,009 E * | 1/2008 | Olson et al. ........... 250/492.21 |
| 2004/0043202 A1 * | 3/2004 | Kawano et al. .......... 428/195.1 |
| 2005/0082498 A1 * | 4/2005 | White .................... 250/492.21 |
| 2005/0173655 A1 * | 8/2005 | Naylor-Smith et al. . 250/492.21 |
| 2006/0208202 A1 * | 9/2006 | Gupta et al. ............ 250/492.21 |
| 2006/0208203 A1 * | 9/2006 | Gupta et al. ............ 250/492.21 |
| 2006/0208204 A1 * | 9/2006 | Gupta et al. ............ 250/492.21 |
| 2007/0221870 A1 * | 9/2007 | Olson et al. ........... 250/492.21 |
| 2008/0078950 A1 * | 4/2008 | Buonodono et al. ..... 250/492.21 |
| 2008/0096359 A1 * | 4/2008 | Gupta et al. ................. 438/302 |

* cited by examiner

*Primary Examiner*—Bernard E Souw

(57) ABSTRACT

A technique for isocentric ion beam scanning is disclosed. In one particular exemplary embodiment, the technique may be realized by an apparatus for isocentric ion beam scanning. The apparatus may comprise an end station having a mechanism for holding and translating a wafer. The apparatus may also comprise a deflector that tilts an ion beam to a predetermined angle and directs the ion beam into the end station. The wafer may be translated with respect to the ion beam for isocentric scanning at least a portion of a surface of the wafer, and wherein the ion beam is maintained at the predetermined angle during isocentric scanning.

20 Claims, 9 Drawing Sheets

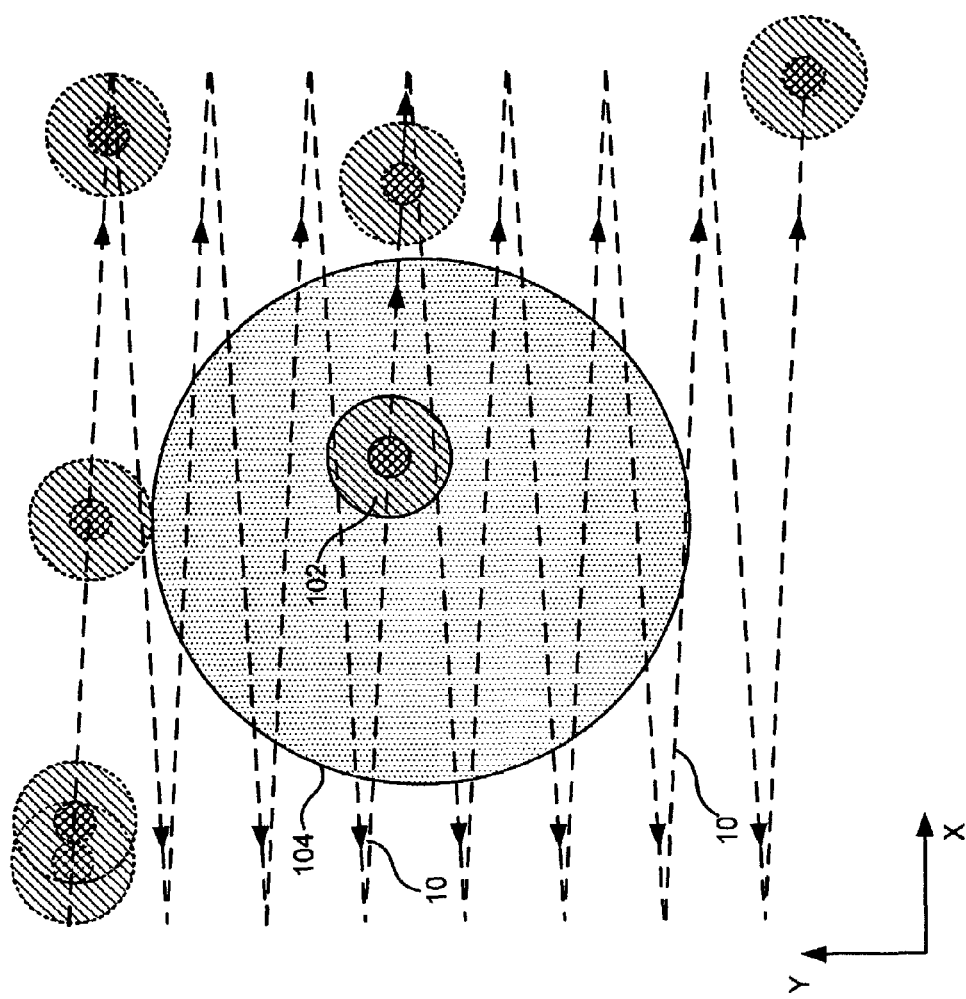

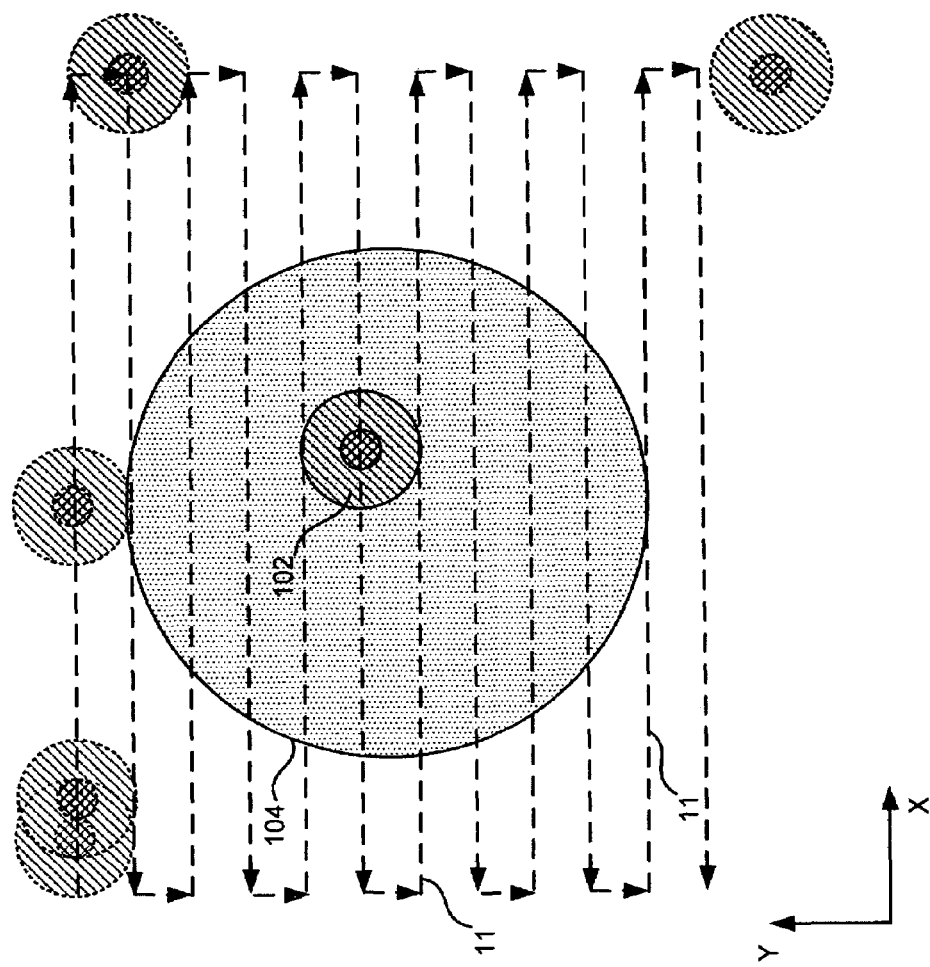

TECHNIQUE FOR ISOCENTRIC ION BEAM SCANNING

FIELD OF THE DISCLOSURE

The present disclosure relates generally to semiconductor manufacturing and, more particularly, to a technique for isocentric ion beam scanning.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is often crucial for proper IC performance. To achieve a desired doping profile, one or more ion species may be implanted in different doses, at different energy levels, and sometimes at different incident angles.

For a uniform distribution of dopant ions, an ion beam is typically scanned across the surface of a target wafer. FIG. 1a shows a typical beam path 10 formed by scanning an ion beam spot 102 across a wafer 104. The ion beam spot 102 may be scanned back and forth in the X direction while the wafer 104 is translated in the Y direction, thereby forming the zig-zag pattern of the beam path 10. FIG. 1b shows another typical beam path 11 formed by scanning the ion beam spot 102 across the wafer 104. Here, the ion beam spot 102 is scanned along straight lines in the X direction and makes square turns at the end of a sweep.

As the semiconductor industry is producing devices with smaller and smaller feature sizes, ion beams with lower energies are required for wafer implantation. Compared with high- or medium-energy ion beams, low-energy ion beams present some unique challenges. For example, a low-energy ion beam usually has a large beam spot, which can cause problems for beam utilization and uniformity tuning. In addition, the shape or current density of a low-energy ion beam can change substantially as it propagates down a beam line. As a result, if different portions of a wafer meet the low-energy ion beam at different positions along the beam line, different dopant profiles may be created for the different portions of the wafer. This problem is illustrated in FIG. 2, wherein an ion beam 202 is propagating along the Z direction. If a wafer 204 meets the ion beam 202 at a first position $Z=Z_1$, the wafer 204 will see a beam spot 206. If the wafer 204 meets the ion beam 202 at a second position $Z=Z_2$, for example, when the ion beam 202 is scanned across the surface of the wafer 204, the wafer 204 will see a beam spot 208 that may be quite different from the beam spot 206. Therefore, the portion of the wafer 204 implanted with the ion beam at beam spot 208 may have a different dopant profile from the portion implanted with the ion beam at beam spot 206. The problem of beam-line variation is not unique to low-energy ion beams but can also be observed in some high-current ion beams.

As a countermeasure to the beam-line variation problem, a concept known as "isocentric scanning" has been proposed. Isocentric scanning generally involves moving a wafer with respect to an ion beam in such a way that the point in space where the ion beam strikes the wafer surface remains the same no matter which part of the wafer surface meets the ion beam. It should be noted that isocentric scanning does not have to cover the entire surface of a wafer but may cover only a portion of the wafer surface.

FIG. 3 illustrates isocentric scanning of a wafer 304. An ion beam 302 may propagate along the Z direction, and the wafer 304 may be translated within the X-Y plane to perform the isocentric scanning. Effectively, the wafer 304 is moved in such a way that a beam spot 306 (i.e., a cross section of the ion beam 302) having the same shape and current density distribution will strike different portions of the surface of the wafer 304 at a same point $(X_0, Y_0, Z_0)$ in space.

FIG. 3 only shows the simplest example of isocentric scanning wherein the ion beam 302 has a normal incidence on the wafer 304. These days, however, it is often necessary to implant a wafer at one or more different incident angles other than the normal incident angle, which technique is known as "angled ion implantation." Sometimes, it may also be desirable to implant different portions of a wafer at different incident angles. In existing ion implantation systems, angled ion implantation is typically accommodated by maintaining an ion beam along a fixed reference direction and tilting a target wafer with respect to the ion beam. To achieve isocentric scanning on a tilted wafer, the wafer has to be moved in a complex pattern with respect to the ion beam.

FIG. 4 illustrates a complex movement of a tilted wafer 404 for isocentric scanning by an ion beam 402. The ion beam 402 propagates along the Z direction. For isocentric scanning, the wafer 404 is moved in such a way that the same beam spot (or ion beam cross section) 406 strikes the surface of the wafer 404. Since the wafer 404 is tilted with respect to the ion beam 402, the wafer 404 is moved not only in the X-Y plane, but also in the Z direction. For example, at position A, the center of the tilted wafer 404 may be at $Z=Z_A$. At position B, the center of the tilted wafer 404 may be at $Z=Z_B$ ($Z_B \neq Z_A$). The movement in the Z direction has to precisely coordinated with the movement in the X-Y plane in order to meet the isocentric scanning requirement.

To precisely control the tilting and the three-dimensional (3-D) translation of a wafer for isocentric scanning, existing ion implantation systems have to be equipped with a fairly complex end station to hold, tilt, and move the wafer. FIG. 5 illustrates a typical setup for isocentric scanning in existing ion implantation systems. An end station 508 may be a process chamber or similar component that houses a mechanism (not shown) for holding a wafer 504 and for controlling wafer movements. An ion beam 502 may propagate along a reference direction 50 and may be directed into the end station 508 via an aperture 510. With respect to the end station 508, the angle of the ion beam 502 is relatively fixed. Isocentric scanning is achieved by tilting and moving the wafer 504, all inside the end station 508. For example, the wafer 504 may be tilted by an angle θ so that the normal direction 52 of the wafer 504 is at an angle θ with respect to the reference direction 50. The mechanism in the end station 508 is capable of moving the wafer 504 in all three dimensions based on the tilt angle θ and the isocentric scanning requirement. Such capabilities necessitate a sophisticated design of the end station 508 that is often expensive to build and maintain.

In view of the foregoing, it would be desirable to provide a technique for isocentric ion beam scanning which overcomes the above-described inadequacies and shortcomings.

SUMMARY OF THE DISCLOSURE

A technique for isocentric ion beam scanning is disclosed. In one particular exemplary embodiment, the technique may be realized by an apparatus for isocentric ion beam scanning. The apparatus may comprise an end station having a mechanism for holding and translating a wafer. The apparatus may also comprise a deflector that tilts an ion beam to a predetermined angle and directs the ion beam into the end station. The wafer may be translated with respect to the ion beam for isocentric scanning at least a portion of a surface of the wafer, and wherein the ion beam is maintained at the predetermined angle during isocentric scanning.

In accordance with other aspects of this particular exemplary embodiment, the deflector may tilt the ion beam with an electrostatic field, a magnetic field, or an electromagnetic field.

In accordance with further aspects of this particular exemplary embodiment, the wafer may be translated in a two-dimensional movement during isocentric scanning.

In accordance with additional aspects of this particular exemplary embodiment, the end station may further comprise a plasma flood gun that can be repositioned based on the predetermined angle of the ion beam.

In accordance with another aspect of this particular exemplary embodiment, the end station may further comprise an aperture that can be repositioned to admit the ion beam into the end station based on the predetermined angle. The aperture may block one or more particles in the ion beam that are not tilted by the deflector.

In another particular exemplary embodiment, the technique may be realized as a method for isocentric ion beam scanning. The method may comprise tilting an ion beam to a predetermined angle. The method may also comprise directing the ion beam into an end station holding a wafer. The method may further comprise translating the wafer with respect to the ion beam for isocentric scanning at least a portion of a surface of the wafer, wherein the ion beam is maintained at the predetermined angle during isocentric scanning.

In accordance with other aspects of this particular exemplary embodiment, the deflector may tilt the ion beam with an electrostatic field, a magnetic field, or an electromagnetic field.

In accordance with further aspects of this particular exemplary embodiment, the wafer may be translated in a two-dimensional movement during isocentric scanning.

In accordance with additional aspects of this particular exemplary embodiment, the method may further comprise preventing charge buildup on the wafer surface with a plasma flood gun that can be repositioned based on the predetermined angle of the ion beam.

In accordance with another aspect of this particular exemplary embodiment, the method may further comprise repositioning an aperture to admit the ion beam into the end station based on the predetermined angle of the ion beam.

In accordance with yet another aspect of this particular exemplary embodiment, the method may further comprise blocking one or more particles in the ion beam that are not tilted by the deflector.

In yet another particular exemplary embodiment, the technique may be realized as at least one signal embodied in at least one carrier wave for transmitting a computer program of instructions configured to be readable by at least one processor for instructing the at least one processor to execute a computer process for performing the method as recited above.

In still another particular exemplary embodiment, the technique may be realized as at least one processor readable carrier for storing a computer program of instructions configured to be readable by at least one processor for instructing the at least one processor to execute a computer process for performing the method as recited above.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 1a shows a typical setup for scanning an ion beam across a wafer.

FIG. 1b shows another setup for scanning an ion beam across a wafer.

DETAILED DESCRIPTION OF EXEMPLARY EMBODIMENTS

Embodiments of the present disclosure provide a new approach for isocentric ion beam scanning wherein an ion beam is tilted to a predetermined angle before the ion beam is directed into an end station for isocentric scanning of a target wafer. With the ion beam maintained at the predetermined angle, there may be no need to tilt the target wafer itself. As a result, isocentric scanning of the target wafer may involve a two-dimensional (2-D), rather than a three-dimensional (3-D), translation of the target wafer. Since it is no longer necessary to tilt the target wafer or to coordinate its 3-D movements, the end station may have a simpler and therefore less expensive design.

Figure 2:
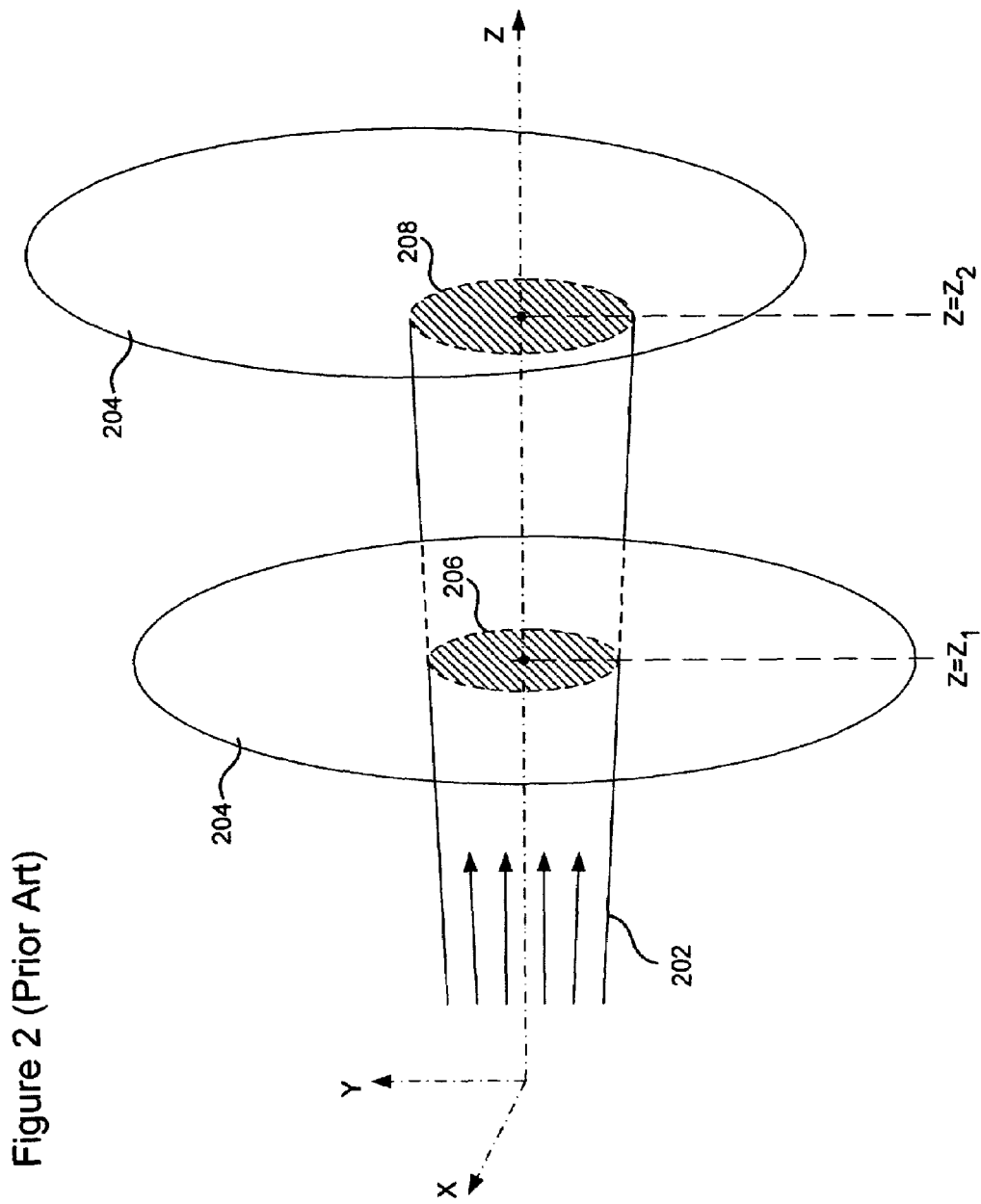
FIG. 2 illustrates a beam-line variation problem in an ion beam.
Figure 3:
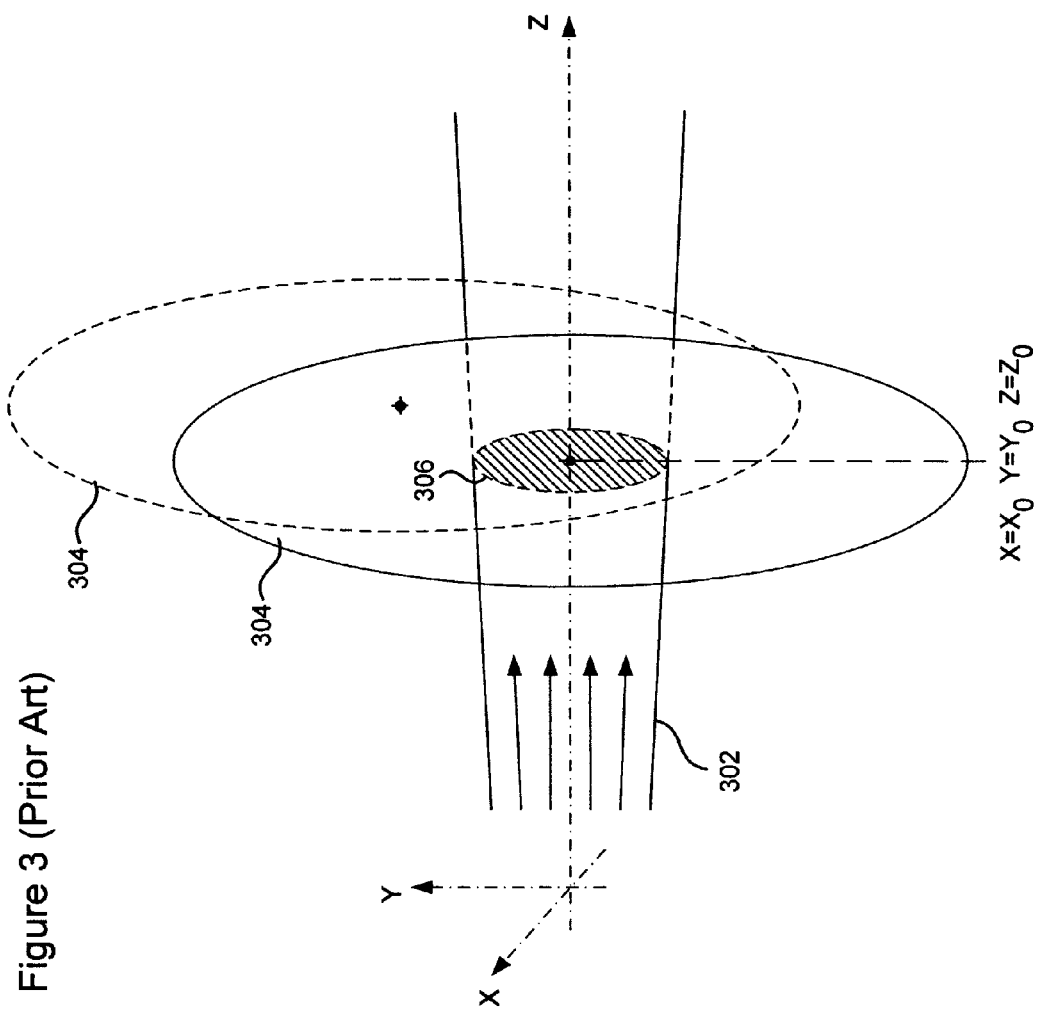
FIG. 3 illustrates isocentric scanning of an ion beam.
Figure 4:
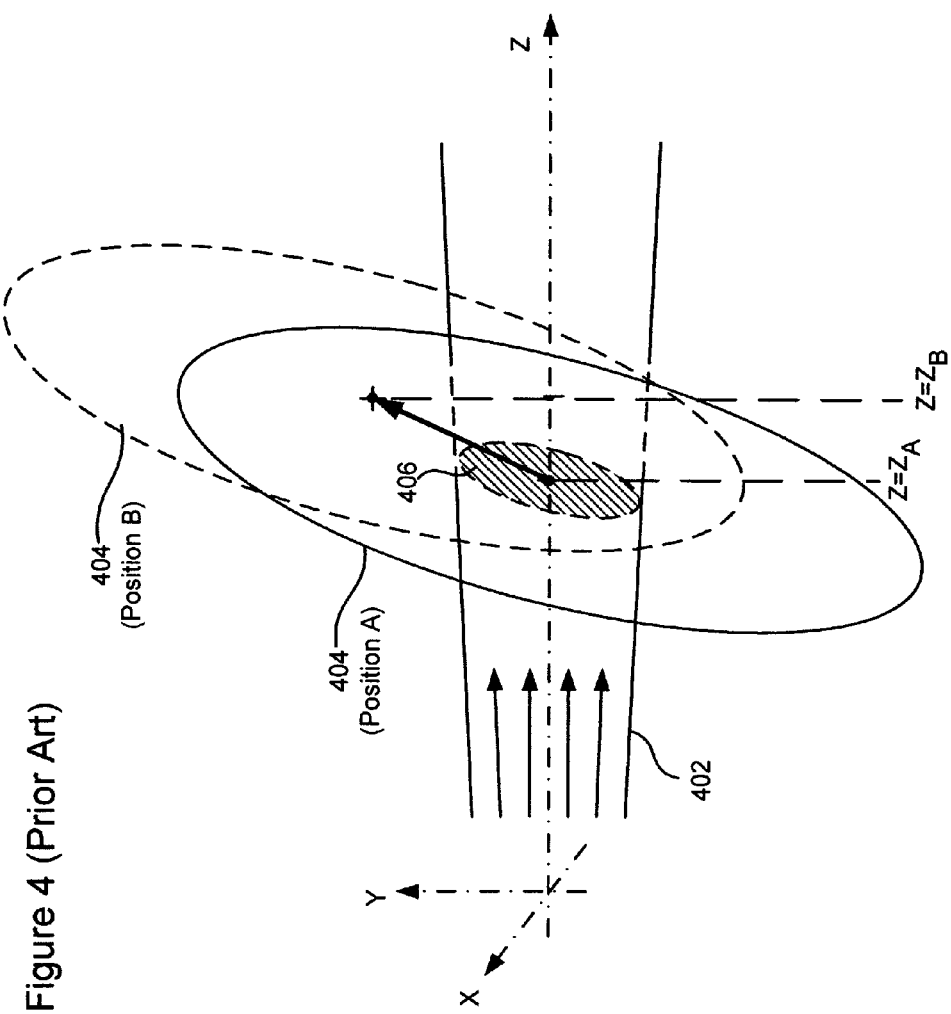
FIG. 4 illustrates a complex movement of a tilted wafer for isocentric ion beam scanning.
Figure 5:
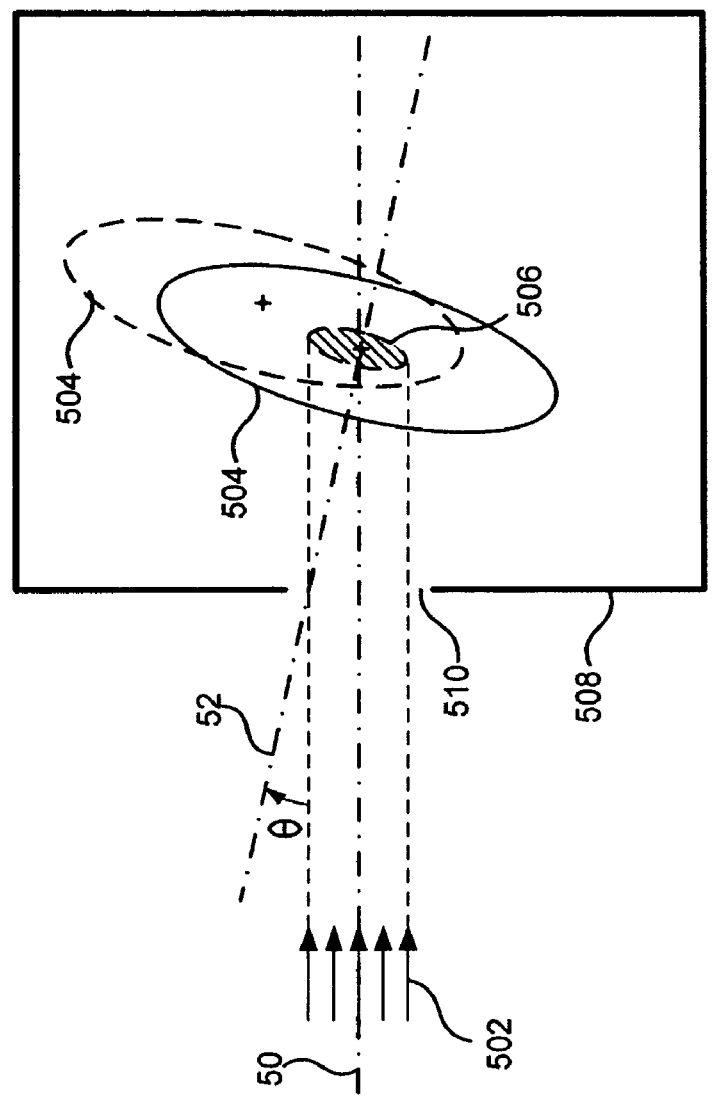
FIG. 5 shows a typical setup for isocentric scanning in existing ion implantation systems.
Figure 6:
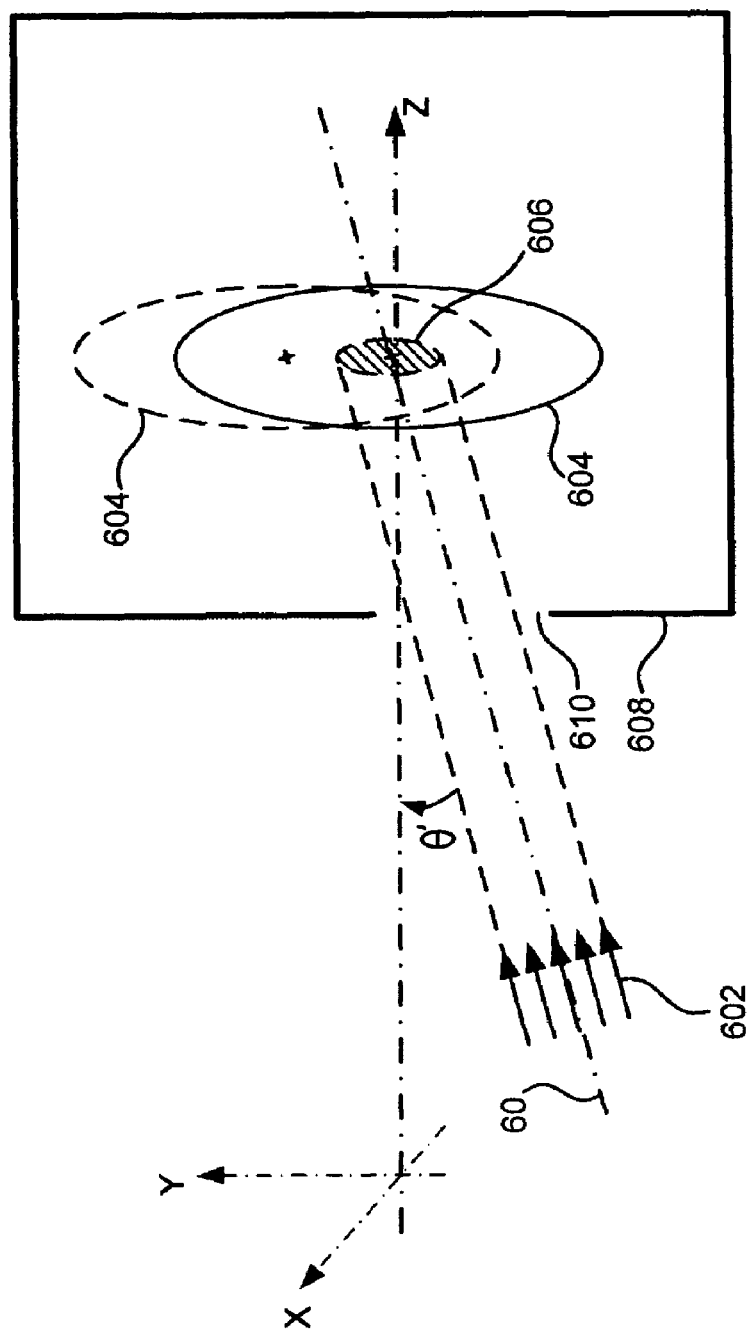
FIG. 6 illustrates an exemplary method for isocentric ion beam scanning in accordance with an embodiment of the present disclosure.

FIG. 6 illustrates an exemplary method for isocentric ion beam scanning in accordance with an embodiment of the present disclosure. In an ion implantation system, an end station 608 may hold a wafer 604. The normal direction of the wafer 604 may be aligned with the Z direction.

First, an ion beam 602 may be generated and an incident angle (e.g., $\theta'$) may be determined for an angled ion implantation on the wafer 604 or a portion thereof.

Next, the ion beam 602 may be tilted to the predetermined angle $\theta'$ with respect to the Z direction before the ion beam 602 is directed into the end station 608 via an aperture 610. Tilting of the ion beam 602 may be achieved in a number of ways. Typically, the ion beam 602 may be tilted with an electrostatic, magnetic, or electromagnetic field. The tilt angle may also be achieved, for example, by adjusting the relative position of the end station 608 with respect to a reference direction 60 of the ion beam 602. Meanwhile, the wafer 604 may maintain its position inside the end station 608 without tilting.

Then, with the ion beam 602 stationary (i.e., at the angle θ'), the wafer 604 may be translated in the X-Y plane, without any movement in the Z direction, so that the portion(s) of the wafer 604 to be implanted will meet the same beam spot 606. Thus, an isocentric scanning of the wafer 604 may be achieved for different incident angles without tilting the wafer 604 or moving it in a complex 3-D pattern.

Figure 7:
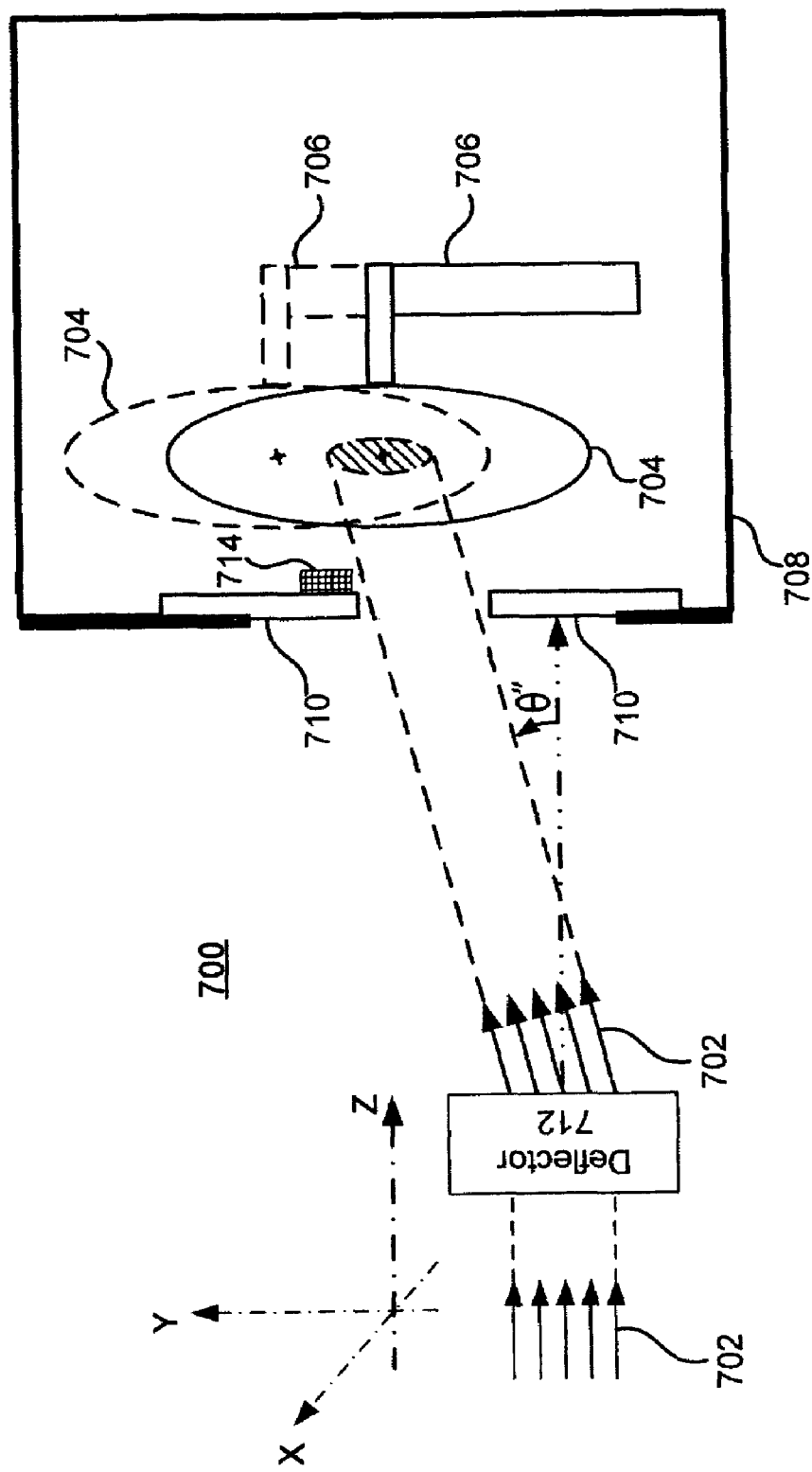
FIG. 7 shows an exemplary system for isocentric ion beam scanning in accordance with an embodiment of the present disclosure.

FIG. 7 shows an exemplary system 700 for isocentric ion beam scanning in accordance with an embodiment of the present disclosure. The system 700 may comprise an end station 708 and a deflector device 712.

The deflector device 712 may employ an electrostatic field, a magnetic field, or a combination thereof to change the propagation direction of an ion beam 702. The deflector device 712 may cause the ion beam 702 to be tilted at an angle θ" with respect to a reference direction (e.g., the Z direction).

The end station 708 may comprise a wafer handling mechanism 706 that can hold a wafer 704 and control its movements (e.g., translation or rotation within the X-Y plane). The end station 708 may also comprise a sliding aperture 710 that can be repositioned to admit the ion beam 702 into the end station 708. The position of the sliding aperture 710 may depend on the tilt angle θ" of the ion beam 702. Particles in the ion beam 702 that have not been deflected to the angle θ" may be blocked by a sidewall of the aperture 710 or a sidewall of the end station 708. The end station 708 may further comprise a plasma flood gun (PFG) 714 that prevents charge buildup on the wafer 704.

In operation, the deflector device 712 may be adjusted to tilt the ion beam 702 to a predetermined angle (e.g., θ"). Then, the sliding aperture 710 (or a relative position between the deflector 712 and the end station 708) may be adjusted to allow the properly tilted ion beam 702 to pass therethrough and enter the end station 708. Then, the wafer handling mechanism 706 may be activated to move the wafer 704 with respect to the ion beam 702 to effectuate isocentric scanning.

According to embodiments of the present disclosure, during an isocentric scanning of a wafer as described herein, the resulting beam path on the wafer is not limited to any particular pattern. When performing an isocentric scanning with a spot beam, for example, the beam path may have a zig-zag pattern as illustrated in FIG. 1a or a raster pattern as illustrated in FIG. 1b.

Figure 8:
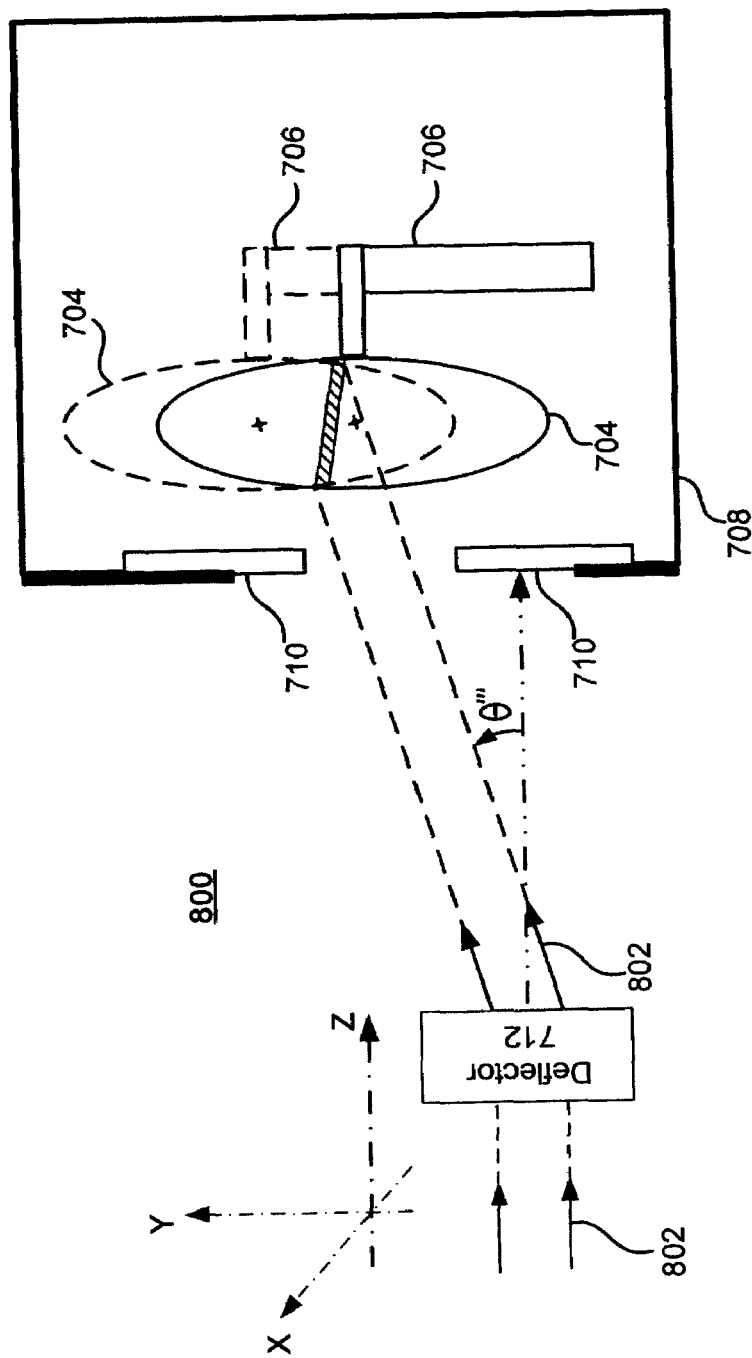
FIG. 8 shows another exemplary system for isocentric ion beam scanning in accordance with an embodiment of the present disclosure.

When performing an isocentric scanning with a ribbon beam, only one-dimensional translation of the wafer may be needed if the ribbon beam is at least as wide as the wafer. One example is shown in FIG. 8. FIG. 8 shows an exemplary system 800 for isocentric ion beam scanning in accordance with an embodiment of the present disclosure. The system 800 may be similar to the system 700 shown in FIG. 7, except that the system 800 employs a ribbon beam 802 for isocentric scanning of the wafer 704. The ribbon beam 802 may be deflected by the deflector 712 to a tilt angle (e.g., θ'") before being directed into the end station 708 via the sliding aperture 710. The ribbon beam 802 may be made no narrower than the diameter of the wafer 704. Since the ribbon beam 802 is wide enough to cover the width of the wafer 704 in the X direction, there may be no need to translate the wafer 704 in the X direction. Instead, an isocentric scanning of the ribbon beam 802 on the wafer 704 may only involve translation of the wafer 704 in the Y direction.

At this point it should be noted that the technique for isocentric ion beam scanning in accordance with the present disclosure as described above typically involves the processing of input data and the generation of output data to some extent. This input data processing and output data generation may be implemented in hardware or software. For example, specific electronic components may be employed in an ion implanter or similar or related circuitry for implementing the functions associated with isocentric ion beam scanning in accordance with the present disclosure as described above. Alternatively, one or more processors operating in accordance with stored instructions may implement the functions associated with isocentric ion beam scanning in accordance with the present disclosure as described above. If such is the case, it is within the scope of the present disclosure that such instructions may be stored on one or more processor readable carriers (e.g., a magnetic disk), or transmitted to one or more processors via one or more signals.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus for isocentric ion beam scanning, the apparatus comprising:
   an end station having a mechanism for holding and translating a wafer;
   a deflector that tilts an ion beam to a predetermined angle relative to a Z direction normal to a front surface of the wafer and directs the ion beam into the end station; and
   wherein the wafer is translated with respect to the ion beam for isocentric scanning at least a portion of the front surface of the wafer, and wherein the ion beam is maintained at the predetermined angle during isocentric scanning, and wherein the wafer is not translated in the Z direction during isocentric scanning.

2. The apparatus according to claim 1, wherein the deflector tilts the ion beam with an electrostatic field.

3. The apparatus according to claim 1, wherein the deflector tilts the ion beam with a magnetic field.

4. The apparatus according to claim 1, wherein the deflector tilts the ion beam with an electromagnetic field.

5. The apparatus according to claim 1, wherein the wafer is translated in a two-dimensional movement during isocentric scanning.

6. The apparatus according to claim 1, wherein the ion beam is a ribbon-shaped ion beam, and wherein the wafer is translated in a one-dimensional movement during isocentric scanning.

7. The apparatus according to claim 1, wherein the end station further comprises a plasma flood gun that can be repositioned based on the predetermined angle of the ion beam.

8. The apparatus according to claim 1, wherein the end station further comprises an aperture that can be repositioned to admit the ion beam into the end station based on the predetermined angle.

9. The apparatus according to claim 8, wherein the aperture blocks one or more particles in the ion beam that are not tilted by the deflector.

10. A method for isocentric ion beam scanning, the method comprising the steps of:
   tilting an ion beam to a predetermined angle relative to a Z direction normal to a front surface of a wafer;
   directing the ion beam into an end station holding the wafer; and
   translating the wafer with respect to the ion beam for isocentric scanning at least a portion of the front surface of the wafer, wherein the ion beam is maintained at the predetermined angle during isocentric scanning, and wherein the wafer is not translated in the Z direction during isocentric scanning.

11. The method according to claim 10, wherein the ion beam is tilted with an electrostatic field.

12. The method according to claim 10, wherein the ion beam is tilted with a magnetic field.

13. The method according to claim 10, wherein the ion beam is tilted with an electromagnetic field.

14. The method according to claim 10, wherein the wafer is translated in a two-dimensional movement during isocentric scanning.

15. The method according to claim 10, wherein the ion beam is a ribbon-shaped ion beam, and wherein the wafer is translated in a one-dimensional movement during isocentric scanning.

16. The method according to claim 10, further comprising: preventing charge buildup on the wafer surface with a plasma flood gun that can be repositioned based on the predetermined angle of the ion beam.

17. The method according to claim 10, further comprising: repositioning an aperture to admit the ion beam into the end station based on the predetermined angle of the ion beam.

18. The method according to claim 10, further comprising: blocking one or more particles in the ion beam that are not tilted by the deflector.

19. At least one signal embodied in at least one carrier wave for transmitting a computer program of instructions configured to be readable by at least one processor for instructing the at least one processor to execute a computer process for performing the method as recited in claim 10.

20. At least one processor readable carrier for storing a computer program of instructions configured to be readable by at least one processor for instructing the at least one processor to execute a computer process for performing the method as recited in claim 10.

* * * * *